(12) United States Patent
Peng et al.

(10) Patent No.: US 8,607,110 B1
(45) Date of Patent: *Dec. 10, 2013

(54) I-R VOLTAGE DROP SCREENING WHEN EXECUTING A MEMORY BUILT-IN SELF TEST

(71) Applicant: Marvell International Ltd., Hamilton (BM)

(72) Inventors: Hsui-Peng Peng, San Jose, CA (US); Jae-Hong Lee, Cupertino, CA (US)

(73) Assignee: Marvell International Ltd. (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/721,397

(22) Filed: Dec. 20, 2012

Related U.S. Application Data

(63) Continuation of application No. 12/607,841, filed on Oct. 28, 2009, now Pat. No. 8,341,476.

(60) Provisional application No. 61/110,339, filed on Oct. 31, 2008.

(51) Int. Cl.
*G01R 31/28* (2006.01)
*G11C 29/00* (2006.01)

(52) U.S. Cl.
USPC .......................................... 714/733; 714/763

(58) Field of Classification Search
USPC ................... 714/733, 734, 30, 763, 718, 721; 365/201, 230.03
See application file for complete search history.

(56) References Cited

U.S. PATENT DOCUMENTS

| | | | |
|---|---|---|---|
| 5,896,331 A | 4/1999 | Crafts | |
| 6,085,334 A | 7/2000 | Giles et al. | |
| 6,347,056 B1 | 2/2002 | Ledford et al. | |
| 6,760,865 B2 | 7/2004 | Ledford et al. | |
| 7,245,141 B2 | 7/2007 | Ong | |
| 7,418,642 B2 | 8/2008 | Taylor et al. | |
| 7,793,187 B2 * | 9/2010 | Wong et al. | 714/736 |
| 7,802,146 B2 * | 9/2010 | Wong et al. | 714/40 |
| 7,890,828 B2 | 2/2011 | Taylor et al. | |
| 7,904,701 B2 * | 3/2011 | Babella et al. | 712/227 |
| 8,046,652 B2 | 10/2011 | Taylor et al. | |
| 8,139,430 B2 | 3/2012 | Buchmann et al. | |
| 8,341,476 B1 * | 12/2012 | Peng et al. | 714/733 |
| 2006/0179378 A1 | 8/2006 | Iida et al. | |
| 2008/0109691 A1 | 5/2008 | Dieffenderfer et al. | |
| 2008/0115026 A1 | 5/2008 | Dieffenderfer et al. | |
| 2008/0195901 A1 | 8/2008 | Solt et al. | |

* cited by examiner

*Primary Examiner* — Phung M Chung

(57) ABSTRACT

A built-in self test (BIST) method and system for testing a memory included on an integrated circuit includes activating a component of the integrated circuit, partitioning the memory into a first part for use by non-BIST components and second part for BIST, and executing BIST on the second part of the memory while the component is operating. While the BIST is executing, the non-BIST components can access the first part of the memory and perform normal functional operations. The BIST method and system finds memory faults that are related to an I-R voltage drop due to the physical placement of the memory relative to power supply sources.

20 Claims, 5 Drawing Sheets

I-R VOLTAGE DROP SCREENING WHEN EXECUTING A MEMORY BUILT-IN SELF TEST

CROSS-REFERENCE TO RELATED APPLICATION

This application is a continuation application of U.S. Non-Provisional application Ser. No. 12/607,841, filed Oct. 28, 2009 (now U.S. Pat. No. 8,341,476), which claims the benefit of U.S. Provisional Application No. 61/110,339, filed Oct. 31, 2008. The contents of U.S. Non-Provisional application Ser. No. 12/607,841 (now U.S. Pat. No. 8,341,476) and U.S. Provisional Application No. 61/110,339 are each incorporated by reference in their entirety.

TECHNICAL FIELD

The present disclosure relates to memory testing. More particularly, the present disclosure relates to screening for memory defects related to I-R voltage drops when executing a built-in self test of a memory.

BACKGROUND

The background description provided herein is for the purpose of generally presenting the context of the disclosure. Work of the present named inventors, to the extent the work is described in this background section, as well as aspects of the description that may not otherwise qualify as prior art at the time of filing, are neither expressly nor impliedly admitted as prior art against the present disclosure.

Integrated circuits are often designed as system on chip (SOC) circuits that include various interfaces, firmware, processors, and/or embedded memories. The embedded memories are used for data storage or processing and are generally tested following fabrication of the SOC to identify potential defects. One testing scheme uses a built-in self test (BIST) scheme that sends predetermined test vectors to the memory. A BIST scheme enables testing of the memory "at speed," i.e., at an operating speed of the target memory.

When the BIST is testing the memory, the remainder of the SOC circuit is not typically running at full functionality or accessing the memory. Accordingly, the current drawn when the memory is undergoing BIST is often relatively small compared to the current drawn if the entire SOC circuit is active. Furthermore, depending on the physical location of the memory on the SOC and the physical layout of the power grid, the I-R voltage drop of the power supply voltage relative to the power supply source could negatively affect the operation of the memory by providing a reduced voltage to the memory when the SOC is at full operation. The I-R voltage drop may be due to the serial resistance of the metal lines providing the power supply. In particular, a memory in a SOC circuit could pass a BIST when the memory is tested without the remainder of the SOC being active, but the memory may have functional failures when the other circuits in the SOC circuit are operating at full functionality and/or accessing the memory.

SUMMARY

The present disclosure defined by the following claims, and nothing in this section should be taken as a limitation on those claims.

A method and system of built-in self test (BIST) for testing a memory included on an integrated circuit is provided. The method and system include activating operation of at least one component of the integrated circuit such that the component is accessing the memory, partitioning at least a part of the memory such that a first part of the memory is for use by the component and a second part of the memory is for use by the BIST, and executing the BIST on the second part of the memory while the component is operating.

Each of the embodiments described herein can be used alone or in combination with one another. The embodiments will now be described with reference to the attached drawings.

DETAILED DESCRIPTION

The disclosure can be better understood with reference to the following drawings and description. The components in the figures are not necessarily to scale, emphasis instead being placed upon illustrating the principles of the present disclosure. Moreover, in the figures, like referenced numerals designate corresponding parts or elements throughout the different views.

Figure 1:
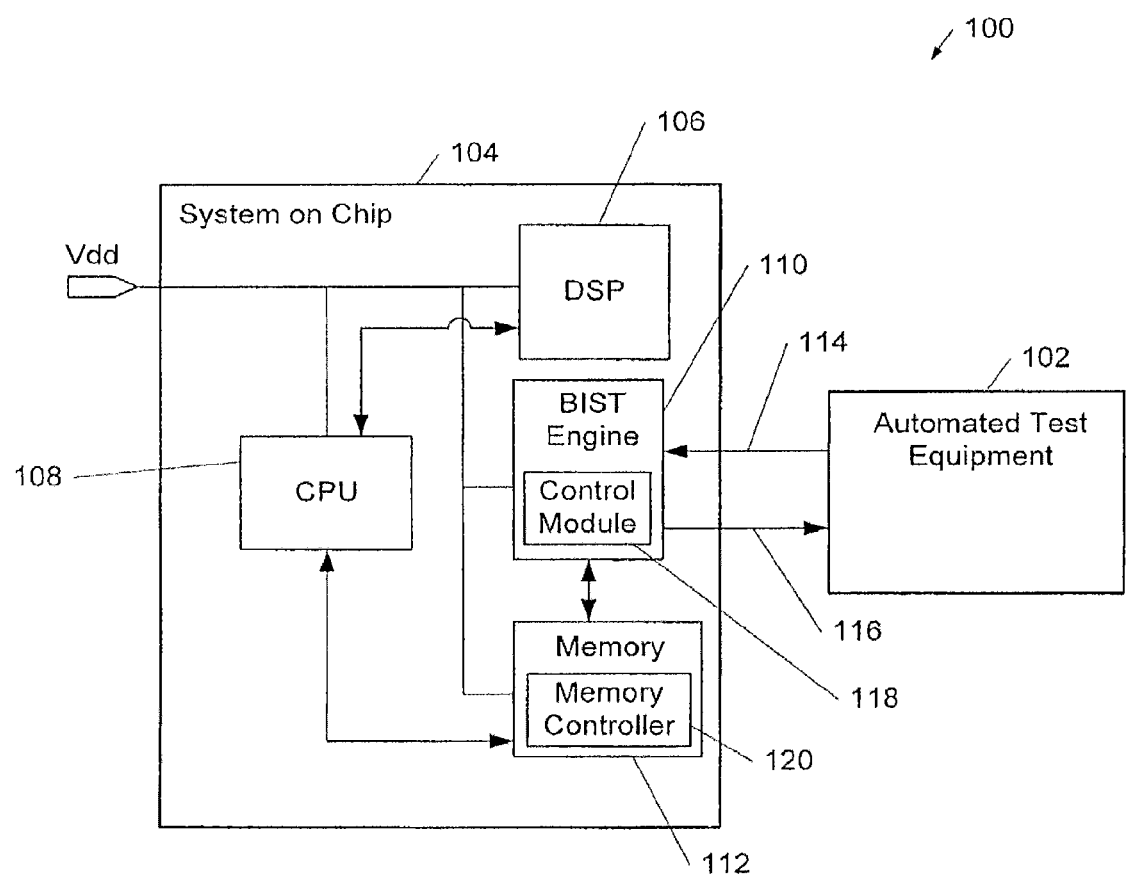
FIG. 1 is a block diagram of a system including automated test equipment and a system on chip circuit with an embedded memory that is testable using built-in self test.

FIG. 1 is a block diagram of a system 100 including automated test equipment (ATE) 102 and a system on chip (SOC) circuit 104 with an embedded memory 112 that is testable using built-in self test (BIST). The SOC circuit 104 shown in FIG. 1 also includes a digital signal processor (DSP) core 106, a central processing unit (CPU) 108, and a BIST engine 110. The DSP core 106 and CPU 108 are examples of components that may be present on the SOC circuit 104. However, other components (not shown) may also be included on the SOC circuit 104, such as microcontrollers, microprocessors, oscillators, interfaces, peripherals, and/or other circuitry. The memory 112 may include embedded memory such as dynamic random access memory, static random access memory, flash memory, and/or other types of addressable memory, and a memory controller 120. All of the components on the SOC circuit 104 are provided a power supply voltage Vdd. In addition, the DSP core 106 and the CPU 108 are in communication with the memory 112 to allow access to the memory for reading and writing data. Other connections between the components on the SOC circuit 104 are possible, although these other connections are not shown in FIG. 1.

The BIST engine 110 implements the BIST system of the present disclosure and is in communication with the memory 112 and the external ATE 102. The BIST engine 110 receives a triggering command from the ATE 102 on the input line 114 when it is desired for a BIST to be executed on the memory 112. The triggering command can be input in a variety of ways (e.g., via a serial or parallel interface) and through a variety of devices (e.g., transistor circuitry). The BIST executed on the memory 112 include writing and reading test vectors to the memory 112 using one or more test algorithms. The test vectors and test algorithms can be pre-stored in the BIST engine 110 and/or received from the ATE 102. The test algorithms read and write test vectors to various addresses of the memory 112 and are sequenced in a certain manner to ensure adequate test coverage. The test algorithms can include March C, March C+, March C−, March LR, checkerboard, and/or other types of test algorithms. A control module 118 within the BIST engine 110 implements the BIST and analyzes the results of the BIST.

After a BIST has been started on the memory 112, a response from the BIST engine 110 is provided to the ATE 102 on an output line 116. The response can include a successful pass of the BIST or a failure of the BIST. The response can also include signifying whether the BIST has completed the entire test algorithm. Furthermore, in the event of a BIST failure, the response can include information about particular addresses or memory cells that have faults. A BIST fails if one or more memory faults are detected via use of the test algorithms. Typically, if data read from a portion of memory does not match the test vector previously written to that portion of the memory, then the BIST fails. The test algorithm coverage includes testing the function of some or all of the memory cells and the function of a memory cell in relation to the memory cells surrounding it. Testing the memory may be performed using various methodologies, one example of which is a March pattern.

Figure 2:
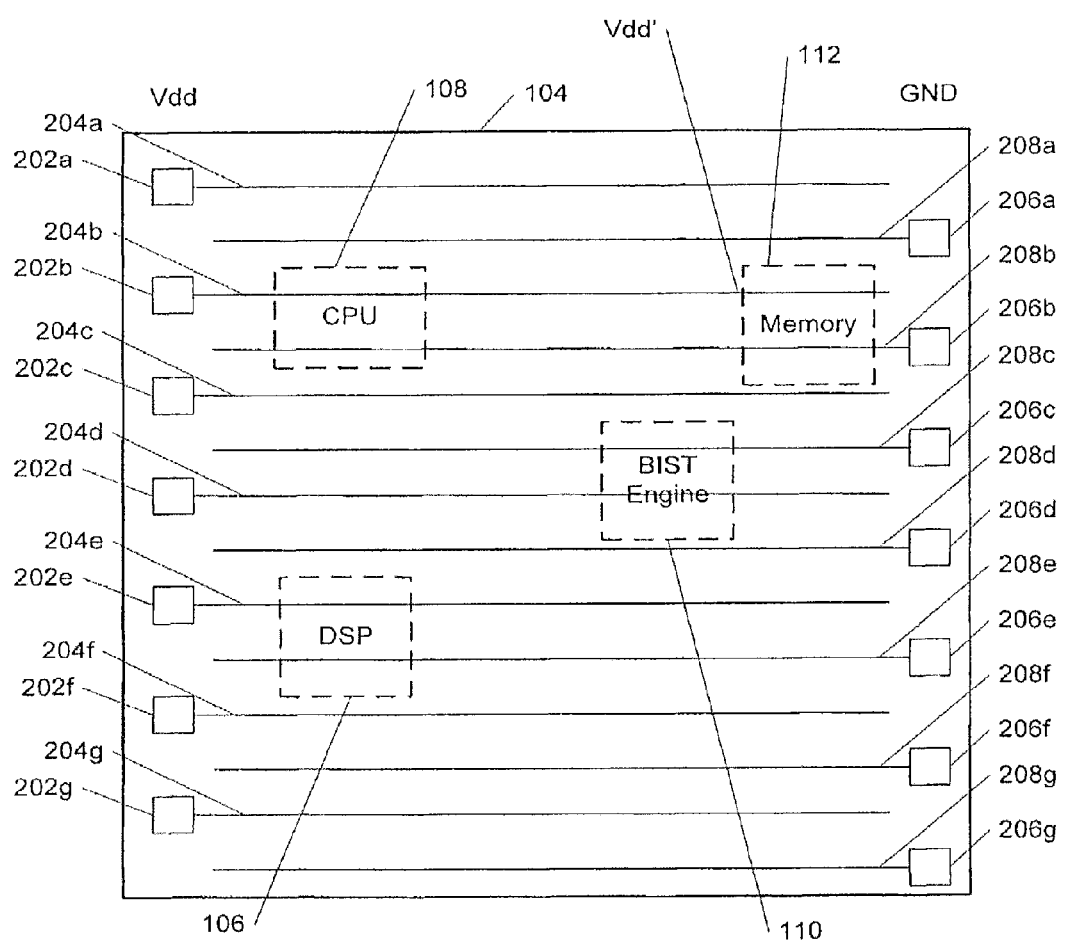
FIG. 2 is a diagram of the physical layout of a system on chip circuit including functional blocks and power supply lines.

FIG. 2 is a diagram of the physical layout of a SOC circuit 104 including functional components and power supply lines. Contacts 202a-g connected to power supply Vdd and contacts 206a-g connected to ground GND are shown with their respective physical lines connected to various components of the SOC circuit 104. The contacts 202a-g are connected to power supply lines 204a-g and the contacts 206a-g are connected to ground lines 208a-g. The diagram in FIG. 2 is intended to be an example of a physical layout of the SOC circuit 104 and the power supply Vdd and ground GND physical lines may be laid out in different patterns than shown in FIG. 2.

In a conventional system, when a BIST is executing on a memory, the remainder of a SOC, including functional components which normally run during full operation of the SOC, is shut down. Because the remainder of the SOC is shut down, only the BIST engine accesses the memory during the BIST. Accordingly, only the memory, a BIST engine, and any input/output interfaces are operational during a BIST. The current drawn by the SOC overall in this situation is relatively small. In contrast, when the SOC is operating during full normal operation, the components of the SOC are at full functionality and access the memory. The current drawn by the SOC when the SOC is in full operation is typically much higher than in the previous case when a BIST is executed on the memory.

When the SOC is in full operation, a significant voltage drop is possible from the power supply source to components on the SOC, since the components on the SOC can be a relatively long physical distance away from the power supply source. This can be seen in FIG. 2 where the memory 112 is physically distant from contact 202b connected to the power supply Vdd. The power supply voltage Vdd' at the memory 112 is reduced by a function of the serial sheet resistance of the metal power supply line 204b. In particular, the voltage Vdd' at the memory 112 is calculated as $Vdd'=Vdd-I*Rs*L$, where Vdd is the nominal power supply voltage at the contact 202b, I is the current flowing in the power supply line, Rs is the sheet resistance of the power supply line, and L is generally the length of the power supply line from the contact 202b to the point at which the memory 112 draws power from the power supply line 204b. Therefore, the I-R voltage drop from the power supply source to the memory 112 is directly proportional to the current flowing in the power supply line. A typical voltage drop can be five percent of Vdd.

If a memory is supplied a power supply voltage Vdd' that is significantly lower than the nominal power supply voltage, memory faults may occur during normal operation of the SOC. Ideally, testing the memory while the SOC is in full operational mode would detect memory faults due to an I-R voltage drop. However, because components of the SOC access the memory during full operation, a BIST simultaneously executed on the memory would conflict with components' accesses of the memory, and the BIST would not successfully complete.

The BIST engine 110 of the present disclosure allows a BIST to be executed on a portion of the memory 112 rather than on the entire memory. By executing a BIST on only a portion of the memory 112, the components on the SOC circuit 104 may access other portions of the memory 112 for their exclusive use. In this way, partial or full operation of the SOC circuit 104 is approximated and the lower current and I-R voltage drop is purposely introduced during the BIST. Memory faults due to the I-R voltage drop can be uncovered during the BIST. More detail of the BIST executing on portions of the memory is described below.

Figure 3:
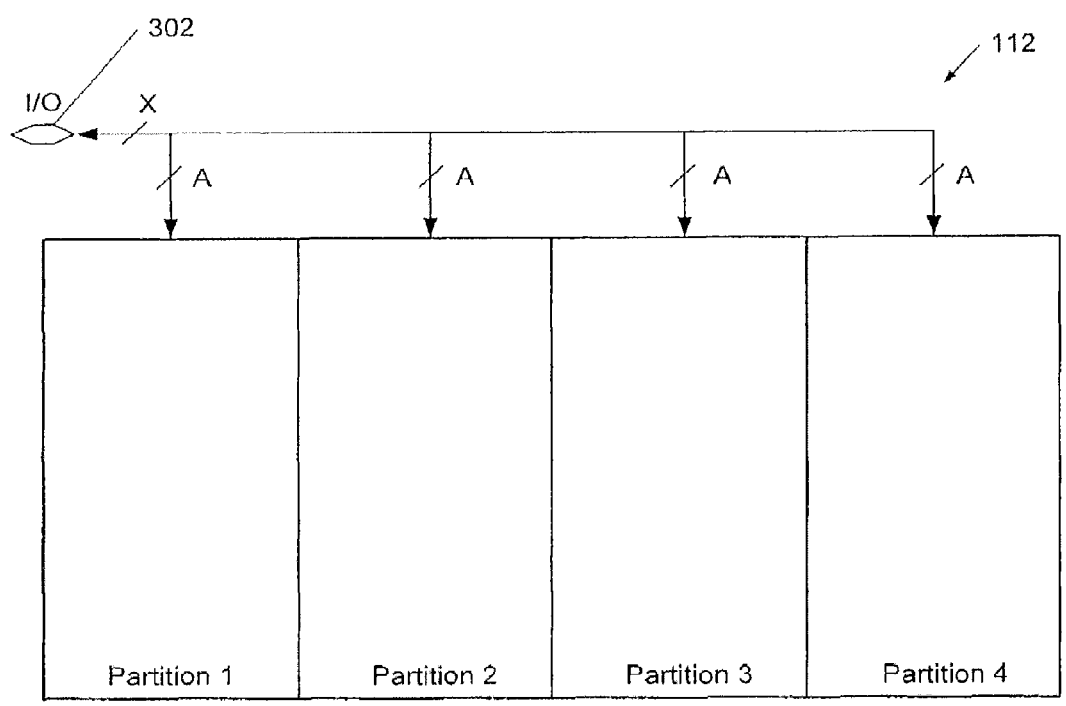
FIG. 3 is a diagram of an embedded memory divided into several partitions for use with the system of FIG. 1.

FIG. 3 is a diagram of the embedded memory 112 divided into several partitions for use with the system 100 of FIG. 1. Portions of the memory 112 are tested using BIST during operation of part or all of the remainder of the SOC circuit 104. By dividing the memory 112 into several partitions, the memory 112 can be tested using BIST under the influence of an I-R voltage drop and reduced current, as described above. The memory controller 120 in the memory 112 may control read and write access to the memory 112 via an I/O interface 302. The I/O interface 302 conveys data to be written to and read from the memory 112 to the memory controller 120. Other control and data lines to and from the memory 112 are possible, but are omitted from FIG. 3 for clarity.

The I/O interface 302 is an X-bit bus carrying data to and from the memory 112. The memory 112 can be divided into multiple partitions so that portions of the memory can be tested separately from other portions of the memory. For example, the memory 112 in FIG. 3 is divided into four partitions, but the memory 112 may be divided into fewer or greater numbers of partitions. The number of partitions the memory 112 is divided into depends on the total capacity of the memory, the desired testing scheme to be used, the desired duration of the BIST, and other factors.

The memory controller 120 sends and receives data to the different partitions of the memory by sending data on part of the X-bit bus. The data lines coupled to each of the partitions of the memory 112 may be an A-bit bus, where A may be an equally divided down number of bits of X. For example, if the I/O interface 302 is a 32-bit bus, then the data lines to each of the four partitions shown in FIG. 3 may be an 8-bit bus. All of the partitions can the same bit width. Or, other bit widths of busses are possible and it is not necessary that the bit width of the data lines to each partition be equal. By specifying data to and from the memory 112 in certain bit ranges of the X-bit bus, access to the memory 112 can be restricted for purposes of the selective BIST testing scheme of the present disclosure.

An alternative scheme to control access to the memory 112 is to configure the memory controller 120 such that particular address ranges are accessible to certain components of the SOC circuit 104 at various times. In this scheme, the BIST engine 110 informs the memory controller 120 of which addresses are for use by other components of the SOC circuit 104, and which addresses may be used by the BIST executed on the memory 112. For example, the DSP core 106 and the CPU 108 may be restricted to using Partition 2 of the memory 112, while the BIST engine 110 is allowed to access Partitions 1, 3, and 4 for executing the BIST. The memory controller 120 acts as a gatekeeper and directs data intended for the particular function to and from the relevant partitions by examining the memory address. The partitions of the memory 112 may also be dynamically created based on instructions from the ATE 102, the control module 118, or other logic.

Figure 4:
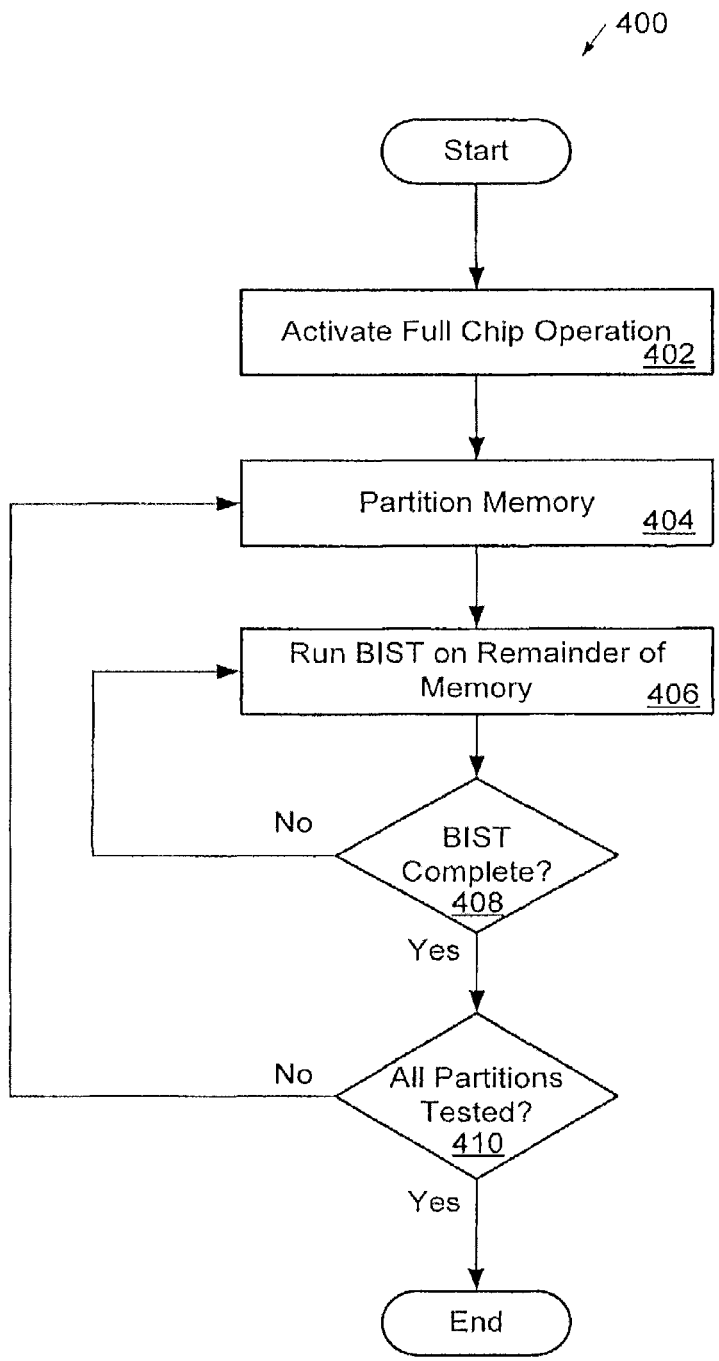
FIG. 4 is a flowchart that represents a method of built-in self test for screening for I-R voltage drop defects in a memory.

FIG. 4 is a flowchart that represents a method 400 of built-in self test for screening for I-R voltage drop defects in a memory. The method 400 may be implemented in the control module 118 in the system 100 described above. Use of the method 400 allows portions of the memory 112 to be tested using BIST and includes coverage of possible memory faults related to I-R voltage drops. At 402, the SOC circuit 104 is activated for full normal operation. At least one of the components on the SOC circuit 104, including, but not limited to, the DSP core 106 and the CPU 108, are activated and allowed access to the memory 112. At 404, the memory 112 is partitioned into multiple portions. At least one portion of the memory 112 is for use by the components of the SOC circuit 104, and at least another portion 112 is for use by the BIST. In particular, a partition of the memory 112 can be for use by the components of the SOC circuit 104, excluding the BIST engine 110. The SOC circuit 104 is configured such that the remaining components of the SOC circuit 104 access the partition for reading and writing data. In some embodiments, the first portion is specifically reserved for use by the components of the SOC circuit 104. Partitioning of the memory 112 at 404 can occur before the SOC circuit 104 is activated for full normal operation at 402 of the method 400.

At 406, a BIST is executed on some or all of the second portion of the memory 112. For example, if Partition 1 of the memory 112 is for access by the non-BIST components of the SOC circuit 104, then the BIST is executed on Partitions 2, 3, and 4. By testing Partitions 2, 3, and 4, most of the memory 112 is tested during this particular BIST test while still allowing the non-BIST components of the SOC circuit 104 to operate in a normal fashion because the components have access to Partition 1 of the memory 112. If the first portion has been specifically reserved for use by the non-BIST components of the SOC circuit 114, then the BIST is executed on the non-reserved portions of the memory 112. Not only are memory cells in the Partitions 2, 3, and 4 individually tested according to the test algorithm executed during the BIST, but other memory cells surrounding a memory cell are also tested if the function of those neighboring cells are affected by writes and/or reads to the memory cell under test. The test coverage of the BIST is determined by the particular test algorithm implemented by the BIST. The general BIST algorithm is described below in relation to FIG. 5.

At 408, it is determined whether the BIST is complete on the second portion of the memory 112. If the BIST is still ongoing on the second portion, then the method 400 returns to 406 and continues to execute the BIST. The BIST is deemed complete when the BIST engine has sent all the test vectors of the test algorithm and sent a completed test signal to the ATE 102 on output line 116, for example. If the BIST is complete on the second portion of the memory 112, then the method 400 continues to 410. At 410, it is determined whether all combinations of the partitions of the memory 112 have been tested. In other words, if only Partition 1 has so far been partitioned for access by non-BIST components, as in the example above, then the method 400 returns to 404 to partition another portion of the memory 112 for access by non-BIST components. The method 400 then continues to 406 to execute a BIST on the next portion of the memory 112.

Continuing the example above, in the second iteration of the method 400, Partition 2 of the memory 112 is for access by non-BIST components, and the BIST is executed on Partitions 1, 3, and 4. Accordingly, in a third iteration of the method 400, Partition 3 of the memory 112 is for non-BIST access and the BIST is executed on Partitions 1, 2, and 4. In a final iteration of the method 400, Partition 4 of the memory 112 is for access by non-BIST components, and the BIST is executed on Partitions 1, 2, and 3. When it is determined at 410 that all combinations of partitions have been tested, then the method 400 is complete.

The power consumption and corresponding current draw are very similar when the components of the SOC circuit 104 are restricted access to a partition of the memory 112 compared to when the components are allowed to access to the entire memory 112. Moreover, the power consumption and current draw do not vary significantly based on the quantity or size of the data being written or read. Accordingly, executing BIST on the memory 112 using the method 400 closely approximates the test coverage when executing BIST in a conventional system, with the benefit of uncovering I-R voltage drop related memory faults. The method 400 may be executed as a supplemental test to the conventional method of BIST described above where the components of the SOC circuit 104 are not in full functional mode. By combining the method 400 with the conventional BIST method, a high test coverage approaching 100% can be attained.

Figure 5:
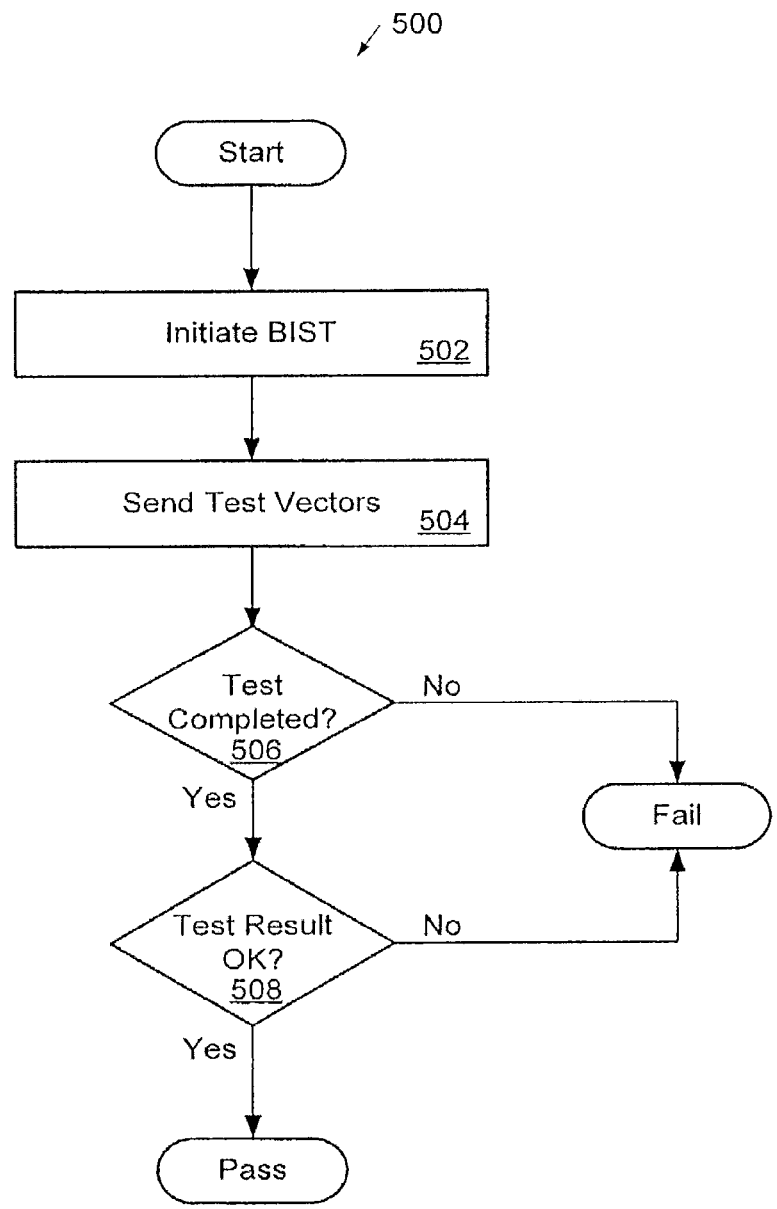
FIG. 5 is a flowchart that represents a method of built-in self testing.

FIG. 5 is a flowchart that represents a method 500 of built-in self testing. The method 500 may be implemented at 406 of the method 400 described in FIG. 4, for example. The BIST engine 110 may implement all or part of the method 500 to test the memory 112. The desired test algorithms and test vectors may be pre-stored in the BIST engine 110 or may be received in instructions or commands from the external ATE 102. As described above, the memory 112 may be divided into multiple partitions for testing purposes. The partitions of the memory 112 for use by the BIST may undergo the BIST according to the method 500.

At 502, the BIST is initiated on the portions of the memory 112 undergoing the test. The BIST is initiated by a triggering command or other signal from the ATE 102 over the input line 114. Once the BIST is initiated at 502, test vectors are sent to the memory at 504. The test vectors may include patterns that test the functionality of single or multiple memory cells simultaneously as well as the functionality of surrounding memory cells. The test algorithms may include March C, March C+, March C−, March LR, checkerboard, and/or other types of test algorithms.

At 506, it is determined whether the BIST is finished and complete for the portions of the memory 112 that are currently being tested. The BIST engine 110 signifies that the BIST is complete by sending a completion signal on the output line 116 to the ATE 102. If the test does not finish successfully at 506 due to memory faults or other failures of the memory 112, then a fail signal is returned and the method 500 is complete. The fail signal may also be sent on the output line 116 to the ATE 102.

However, if the test finishes successfully at 506, then it is determined at 508 whether the result of the BIST is successful. If the BIST uncovers memory faults, then the BIST engine returns a fail signal on the output line 116 to the ATE 102. Information about the specific memory faults and/or addresses may also be sent to the ATE 102 on the output line 116. If the BIST is successful at 508, then a pass signal is returned to the ATE 102 on the output line 116 and the method 500 is complete. In this case, according to the method 400 described earlier, the next partition of memory is apportioned and a BIST is executed on the next combination of memory partitions. The method 500 (operating as 406 of the method 400) may be executed again on the next combination of memory partitions, assuming that all combinations of partitions have not yet been tested.

All of the discussion above, regardless of the particular implementation being described, is exemplary in nature, rather than limiting. Although specific components of the disclosed system are described, methods, systems, and articles of manufacture consistent with the disclosed system may include additional or different components. For example, components of the disclosed system may be implemented by one or more of: control logic, hardware, a microprocessor, microcontroller, application specific integrated circuit (ASIC), discrete logic, or a combination of circuits and/or logic. Further, although selected aspects, features, or components of the implementations are depicted as hardware or software, all or part of the systems and methods consistent with the disclosed system may be stored on, distributed across, or read from machine-readable media, for example, secondary storage devices such as hard disks, floppy disks, and CD-ROMs; a signal received from a network; or other forms of ROM or RAM either currently known or later developed. Any act or combination of acts may be stored as instructions in computer readable storage medium. Memories may be DRAM, SRAM, Flash or any other type of memory. Programs may be parts of a single program, separate programs, or distributed across several memories and processors.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs and rule sets may be parts of a single program or rule set, separate programs or rule sets, or distributed across several memories and processors.

It is intended that the foregoing detailed description be understood as an illustration of selected forms that the present disclosure can take and not as a definition of the present disclosure. It is only the following claims, including all equivalents, that are intended to define the scope of this present disclosure.

What is claimed is:

1. A method of testing memory, the method comprising:
    accessing, with a non-built-in self test (BIST) component, a first part of a memory, the memory being partitioned to have the first part for access by the non-BIST component, and a second part for execution of a BIST by a BIST controller; and
    sending, with the BIST controller, test vectors to the second part of the memory to execute the BIST while the non-BIST component is accessing the first part of the memory.

2. The method of claim 1, wherein the memory is partitioned into multiple partitions, wherein the first part of the memory comprises one of the partitions and the second part of the memory comprises a remainder of the partitions.

3. The method of claim 2, further comprising:
    iterating through the multiple partitions of the memory to execute the BIST on all of the multiple partitions of the memory.

4. The method of claim 1, wherein sending, with the BIST controller, test vectors to the second part of the memory to execute the BIST while the non-BIST component is accessing the first part of the memory comprises: sending the test vectors to the second part along at least one first data line; and
    further comprising: communicating data between the non-BIST component and the first part along at least one second data line,
    wherein each of the at least one first data line and the at least one second data line have the same bit width.

5. The method of claim 1, further comprising:
    reserving the first part of the memory for access by the non-BIST component, the second part comprising non-reserved partitions,
    wherein sending test vectors to execute the BIST comprises sending the test vectors to the non-reserved partitions of the memory.

6. The method of claim 1, further comprising:
    communicating, with a memory controller, first data only between the BIST controller and the second part; and
    communicating, with the memory controller, second data only between the non-BIST component and the first part.

7. The method of claim 1, further comprising:
    specifying, with a memory controller, data communicated to and from the memory in bit ranges of an X-bit bus; and
    controlling, with the memory controller, access to the first and second parts of the memory based on specifying the data in the bit ranges.

8. The method of claim 1, further comprising:
    identifying, with a memory controller, first memory addresses that correspond to the first part of the memory and second memory addresses that correspond to the second part of the memory,
    wherein sending, with the BIST controller, the test vectors to the second part of the memory to execute the BIST while the non-BIST component is accessing the second part of the memory comprises: sending, with the BIST controller, test vectors to portions of the memory having the second memory addresses while the non-BIST component is communicating data to portions of the memory having the first memory addresses.

9. The method of claim 1, further comprising:
    receiving, with the BIST controller, a trigger command from an automated test equipment,
    wherein sending the test vectors to execute the BIST comprises sending, with the BIST controller, the test vectors in response to receiving the trigger command.

10. The method of claim 1, further comprising:
    returning, with the BIST controller, a pass result to an automated test equipment in response to the BIST being successful; and
    returning, with the BIST controller, a fail result to the automated test equipment in response to the BIST being a failure.

11. An integrated circuit comprising:
    a memory partitioned to have a first part and a second part;
    a non-built-in self test (BIST) component configured to access the first part; and
    a BIST controller configured to send test vectors to the second part of the memory to execute a BIST while the non-BIST component is accessing the first part of the memory.

12. The integrated circuit of claim 11, wherein the memory is partitioned into multiple partitions, wherein the first part comprises one of the partitions and the second part comprises a remainder of the partitions.

13. The integrated circuit of claim 12, wherein the BIST controller is configured to send the test vectors to all of the multiple partitions over multiple iterations of the BIST,
wherein the one of the partitions for the first part and at least one of the remainder of the partitions for the second part is different for each of the multiple iterations.

14. The integrated circuit of claim 11,
wherein the BIST controller is configured to send the test vectors to the second part along at least one first data line,
wherein the non-BIST component is configured to access the first part by communication of data along at least one second data line, and
wherein each of the at least one first data line and the at least one second data line have the same bit width.

15. The integrated circuit of claim 11, further comprising:
a memory controller configured to reserve the first part of the memory for access by the non-BIST component, the second part comprising non-reserved partitions,
wherein the BIST controller is configured to send the test vectors to the non-reserved partitions to execute the BIST.

16. The integrated circuit of claim 11, further comprising:
a memory controller configured to:
communicate first data only between the BIST controller and the second part; and
communicate second data only between the non-BIST component and the first part.

17. The integrated circuit of claim 11, further comprising:
a memory controller configured to:
specify data communicated to and from the memory in bit ranges of an X-bit bus; and
control access to the first and second parts of the memory based on specification of the data in the bit ranges.

18. The integrated circuit of claim 11, further comprising:
a memory controller configured to identify first memory addresses that correspond to the first part of the memory and second memory addresses that correspond to the second part of the memory,
wherein the BIST controller is configured to send the test vectors to portions of the memory having the second memory addresses while the non-BIST component is communicating data to portions of the memory having the first memory addresses.

19. The integrated circuit claim 11, wherein the BIST controller is further configured to:
receive a trigger command from an automated test equipment; and
send the test vectors to execute the BIST in response to receipt of the trigger command.

20. The method of claim 11, wherein the BIST controller is further configured to:
return a pass result to an automated test equipment in response to the BIST being successful; and
return a fail result to the automated test equipment in response to the BIST being a failure.

* * * * *